United States Patent [19]

Nakahara et al.

[11] Patent Number: 5,068,148

[45] Date of Patent: Nov. 26, 1991

[54] DIAMOND-COATED TOOL MEMBER, SUBSTRATE THEREOF AND METHOD FOR PRODUCING SAME

[75] Inventors: Kei Nakahara; Keiichi Sakurai; Toshihiko Okamura; Hironori Yoshimura, all of Tokyo; Hiroyuki Eto; Noribumi Kikuchi, both of Omiya, all of Japan

[73] Assignee: Mitsubishi Metal Corporation, Tokyo, Japan

[21] Appl. No.: 454,513

[22] Filed: Dec. 21, 1989

[30] Foreign Application Priority Data

Dec. 21, 1988 [JP] Japan .................................. 63-322764
Mar. 2, 1989 [JP] Japan .................................. 1-50534

[51] Int. Cl.$^5$ ........................ B32B 15/04; B32B 33/00
[52] U.S. Cl. ........................................ 428/335; 51/295; 51/307; 51/309; 75/240; 75/242; 76/DIG. 11; 407/119; 428/334; 428/408; 428/698
[58] Field of Search ............... 428/698, 408, 457, 469, 428/697, 334, 335, 336; 51/295, 307, 309; 407/119; 76/DIG. 11; 75/240, 242

[56] References Cited

U.S. PATENT DOCUMENTS

| | | | |
|---|---|---|---|
| 3,882,579 | 5/1975 | Peacock | 407/119 |
| 4,063,907 | 12/1977 | Lee et al. | 51/295 |
| 4,108,614 | 8/1978 | Mitche | 51/295 |
| 4,156,329 | 5/1979 | Daniels et al. | 51/295 |
| 4,171,973 | 10/1979 | Hara et al. | 51/307 |
| 4,224,380 | 9/1980 | Bovenkerk et al. | 51/309 |
| 4,231,762 | 11/1980 | Hara et al. | 51/309 |
| 4,370,149 | 1/1983 | Mara et al. | 51/309 |
| 4,437,800 | 3/1984 | Araki et al. | 407/119 |
| 4,642,003 | 2/1987 | Yoshimura | 407/119 |
| 4,698,266 | 10/1987 | Buljan et al. | 428/698 |
| 4,731,296 | 3/1988 | Kikuchi et al. | 76/DIG. 11 |
| 4,764,434 | 8/1988 | Aronsson et al. | 428/408 |
| 4,837,089 | 6/1989 | Araki et al. | 428/408 |
| 4,844,988 | 7/1989 | Ishizuka et al. | 428/408 |
| 4,959,929 | 10/1990 | Burnand et al. | 51/307 |

FOREIGN PATENT DOCUMENTS

| | | |
|---|---|---|
| 0251264 | 1/1988 | European Pat. Off. . |
| 02544560 | 1/1988 | European Pat. Off. . |
| 0288065 | 10/1988 | European Pat. Off. . |
| 0298729 | 1/1989 | European Pat. Off. . |
| 0073392 | 6/1979 | Japan . |
| 6152541 | 4/1981 | Japan . |
| 0025282 | 3/1982 | Japan . |
| 0126972 | 7/1983 | Japan . |
| 60-207703 | 11/1985 | Japan . |
| 1106494 | 5/1986 | Japan . |
| 1124573 | 6/1986 | Japan . |
| 2196371 | 8/1987 | Japan . |
| 2214166 | 9/1987 | Japan . |
| 63-45372 | 4/1988 | Japan . |

OTHER PUBLICATIONS

Aug. 6, 1990 communication from the European Patent Office European Search Report and Annex from application no. EP 89 12 3666.

Primary Examiner—Ellis P. Robinson
Assistant Examiner—Archene Turner
Attorney, Agent, or Firm—Scully, Scott, Murphy & Presser

[57] ABSTRACT

A tool member includes a tungsten carbide based cemented carbide substrate and a diamond coating deposited on the substrate. The substrate has two diffraction peaks $K\alpha_1$ and $K\alpha_2$ indexed by index of pane (211) for tungsten carbide in X-ray diffraction. The peaks satisfy the relationship of $l_1/l_2 \leq 35$, where $l_1$ and $l_2$ are heights of the peaks $K\alpha_1$ and $K\alpha_2$ measured from a base of a trough between the two diffraction peaks. For manufacturing the tool member, a green compact is first sintered to provide a tungsten carbide based cemented carbide substrate. Subsequently the substrate is ground and subsequently heat-treated at a temperature between 1000° C. and 1600° C. in a vacuum or in a non-oxidizing atmosphere. Thereafter, a diamond coating is formed on the substrate by vapor-deposition method.

3 Claims, 1 Drawing Sheet

DIAMOND-COATED TOOL MEMBER, SUBSTRATE THEREOF AND METHOD FOR PRODUCING SAME

BACKGROUND OF THE INVENTION

1. Field of the Invention

The present invention relates to a tool member having a tungsten carbide (WC) based cemented carbide substrate and a diamond coating deposited thereon, in which the bonding strength between the diamond coating and the substrate is extremely high.

2. Prior Art

A conventional diamond-coated tool member of tungsten carbide based cemented carbide, which is used for tools such as a cutting insert, and end mill, a drill, and the like, is produced by grinding an outermost portion of a tungsten carbide based cemented carbide substrate, subsequently subjecting the substrate to chemical etching with dilute nitric acid, sulfuric acid, and the like to remove cobalt (Co) existing in the outermost portion of the substrate, and forming a diamond coating having an average layer thickness of 0.5 μm-20 μm on the substrate by a known vapor deposition method. The tungsten carbide based cemented carbide substrate has generally the following composition in terms of % by weight, excluding unavoidable impurities:

cobalt as a binder phase forming component: 1% to 25%;

optionally, as a dispersed phase forming component, at least one material selected from the group consisting of carbides of metals selected from Groups $IV_A$, $V_A$, and $VI_A$ of the Periodic Table and their solid solutions: 0.5% to 30%; and tungsten carbide as the dispersed phase forming component comprising the reminder of the composition.

In the conventional diamond-coated tool member of tungsten carbide based cemented carbide mentioned above, however, the bonding strength between the diamond coating and the substrate is low. Therefore, when the tools formed of the tool members are used for interrupted cutting of Al-Si alloy or the like or for heavy-duty cutting such as high feed cutting and deep cutting, the diamond coating is susceptible to separation from the substrate, and the tool life is relatively short.

SUMMARY OF THE INVENTION

It is therefore an object of the present invention to provide a diamond-coated tool member of tungsten carbide based cemented carbide substrate, in which bonding strength between the diamond coating and the substrate is extremely high.

Another object of the invention is to provide a tungsten carbide based cemented carbide substrate suitably used to produce the aforesaid diamond-coated tool member.

Further object of the invention is to provide a process for producing the aforesaid tool member.

According to a first aspect of the present invention, there is provided a tool member having a tungsten carbide based cemented carbide substrate and a diamond coating deposited on the substrate, the substrate having two diffraction peaks $K\alpha_1$ and $K\alpha_2$ indexed by index of plane (211) for tungsten carbide in X-ray diffraction, wherein the two diffraction peaks $K\alpha_1$ and $K\alpha_2$ satisfy the relationship of $l_1/l_2 \leq 35$, where $l_1$ and $l_2$ are heights of the two peaks $K\alpha_1$ and $K\alpha_2$ measured from a base of a trough between the two peaks $K\alpha_1$ and $K\alpha_2$, whereby bonding strength between the substrate and the diamond coating is increased.

According to a second aspect of the present invention, there is provided a tungsten carbide based cemented carbide substrate for diamond-coated tool member, having two diffraction peaks $K\alpha_1$ and $K\alpha_2$ indexed by index of plane (211) for tungsten carbide in X-ray diffraction, wherein the two diffraction peaks $K\alpha_1$ and $K\alpha_2$ satisfy the relationship of $l_1/l_2 \leq 35$, where $l_1$ and $l_2$ are heights of the two peaks $K\alpha_1$ and $K\alpha_2$ measured from a base of a trough between the two peaks $K\alpha_1$ and $K\alpha_2$, whereby bonding strength between the substrate and a diamond coating of the diamond-coated tool member is increased.

According to a third aspect of the present invention, there is provided a method for producing a diamond-coated tool member of tungsten carbide based cemented carbide comprising the steps of:

sintering a green compact to produce a tungsten carbide based cemented carbide substrate;

grinding the tungsten carbide based cemented carbide substrate;

subsequently heat-treating the tungsten carbide based cemented carbide substrate at a temperature between 1000° C. and 1600° C. in a vacuum or in a non-oxidizing atmosphere; and subsequently forming a diamond coating on the substrate by a vapor-deposition method.

DETAILED DESCRIPTION OF THE INVENTION

Figure 1:
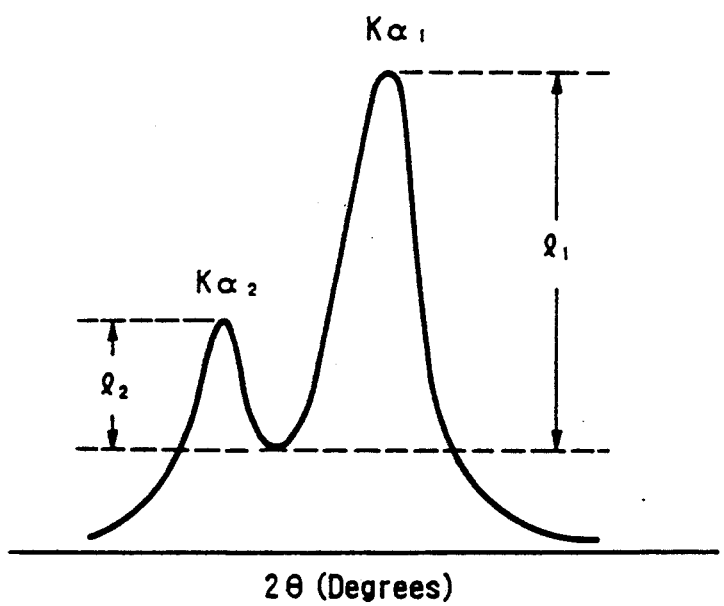
FIG. 1 is an illustration showing X-ray diffraction peaks indexed by index of plane (211) for tungsten carbide in the case of subjecting a substrate of a tool member in accordance with the present invention to X-ray diffraction.

The inventors have observed that conventional diamond-coated tungsten carbide based cemented carbide has the low bonding strength between the diamond coating and the substrate, because the debris of tungsten carbide produced during the grinding operation adheres to the surface of the substrate, so that this debris tends to cause separation of the diamond coating from the substrate. According to the further investigation the inventors have found that if heat-treatment operation is carried out after tungsten carbide based cemented carbide is ground, the debris of tungsten carbide produced during the grinding operation dissolves into the binder phase and precipitates on the undissolved tungsten carbide. As a result, tungsten carbide of the surface causes the grain growth and the surface becomes rough, and the internal stress of the surface produced by the grinding operation is reduced. Thus, when the diamond coating is formed on the heat-treated substrate to provide a diamond-coated tool member, the bonding strength between the diamond coating and the substrate is extremely increased.

According to a subsequent analysis, it has also been found that the substrate of the above diamond-coated tool member has two diffraction peaks $K\alpha_1$ and $K\alpha_2$ indexed by index of plane (211) for tungsten carbide in X-ray diffraction, and that the two diffraction peaks $K\alpha_1$ and $K\alpha_2$ satisfies the relationship of $l_1/l_2 \leq 35$, where $l_1$ and $l_2$ are heights of the peaks $K\alpha_1$ and $K\alpha_2$ measured from the base of the trough between the two diffraction peaks $K\alpha_1$ and $K\alpha_2$.

In contrast, in the conventional diamond-coated tool member, the substrate has one or two diffraction peaks indexed by index of plane (211) for tungsten carbide in X-ray diffraction, and even in the case of the conventional one having the two diffraction peaks $K\alpha_1$ and $K\alpha_2$, the ratio of $l_1/l_2$ exceeds 35.

A manufacturing method of the aforesaid diamond-coated tool member of the present invention involves blending starting material powders into a prescribed composition to provide a green compact, sintering the green compact at a temperature of from 1350° C. to 1500° C. to produce a tungsten carbide based cemented carbide substrate, subsequently grinding the tungsten carbide based cemented carbide substrate, subsequently heat-treating the ground substrate at a temperature between 1000° C. and 1600° C. for a prescribed period of time in a vacuum or in a non-oxdizing atmosphere, subsequently subjecting the substrate to chemical etching to remove cobalt existing in the outermost portion of the substrate; subsequently subjecting the surface of the substrate to ultrasonic waves to activate the surface by hard particles such as diamond powder; and subsequently forming a diamond coating on the substrate by a vapor deposition method.

With the above heat-treatment operation, the debris of tungsten carbide produced during the grinding operation dissolves into the binder phase and precipitates on the undissolved tungsten carbide. As a result, tungsten carbide of the surface causes the grain growth and the surface becomes rough, and the internal stress of the surface produced by the grinding operation is reduced. Thus, the substrate of the diamond-coated tool member becomes to have two diffraction peaks $K\alpha_1$ and $K\alpha_2$ which satisfy the relationship of $l_1/l_2 \leq 35$, where $l_1$ and $l_2$ are heights of the peaks $K\alpha_1$ and $K\alpha_2$ measured from the base of the trough between the two diffraction peaks $K\alpha_1$ and $K\alpha_2$, and the bonding strength between the diamond coating and the substrate is extremely increased.

In the foregoing, if the heat-treating temperature is set to be below 1000° C., the substrate does not have two diffraction peaks separated from each other, so that the desired bonding strength between the diamond coating and the substrate is not obtained. On the other hand, if the temperature exceeds 1600° C., crystal grains of the substrate become bulky, so that the mechanical strength of the substrate is decreased. What is worse, the surface of the substrate becomes extraordinarily rough, so that the substrate cannot be used for manufacturing a tool member. In addition, the period of time of the heat-treatment is 30 minutes to 90 minutes, in the case where the tool member is a cutting insert.

Furthermore, the tungsten carbide based cemented carbide of the substrate contains, excluding unavoidable impurities, 1% by weight to 25% by weight of cobalt as a binder phase forming component and balance tungsten carbide as a dispersed phase forming component.

If the cobalt content is less than 1% by weight, the desired toughness and mechanical strength is not obtained. On the other hand, if the substrate contains more than 25% by weight of cobalt, the wear resistance of the substrate is extremely decreased. Particularly, in the case of a tool member for cutting, the cobalt content in the substrate is preferably not more than 10% by weight.

The aforesaid substrate may further contain, as a dispersed phase forming component, 0.5% by weight to 30% by weight of at least one material selected from the group consisting of carbides, nitrides and carbo-nitrides of metals selected from Groups $IV_A$, $V_A$, and $VI_A$ of the Periodic Table, and their solid solutions.

The carbides, the nitrides, and so on are added for the purpose of increasing wear resistance in the substrate, and their total content should preferably be 0.5% by weight to 30% by weight. If the content of the carbides, the nitrides, and so on is less than 0.5% by weight, sufficient wear resistance cannot be obtained. On the other hand, if the substrate contains more than 30% by weight of the carbides, the nitrides, and so on, the toughness of the substrate becomes extremely decreased.

The diamond coating according to the present invention has an average layer thickness of 0.5 $\mu$m to 20 $\mu$m. If the diamond layer thickness is less than 0.5 $\mu$m, the diamond coating fails to have a desired wear resistance. If the thickness is more than 20 $\mu$m, the diamond coating is susceptible to chipping and subsequent separation from the substrate.

As described above, in the diamond-coated tool member of tungsten carbide based cemented carbide in accordance with the present invention, bonding strength between a tungsten carbide based cemented carbide substrate and a diamond coating of the tool member is extremely high. This will make the tool life relatively long. Therefore, the diamond-coated tool member has superior cutting performance for extended periods where the tool member is used in cutting tools mentioned above, various dies, printer-heads and wear-resistant tools such as a guide roller for a hot rolling mill, a seaming roll for a tube mill, and the like.

The diamond-coated tool member of tungsten carbide based cemented carbide in accordance with the present invention and the process for producing the same will be described in detail by way of an example.

EXAMPLE

There were prepared starting material powders of tungsten carbide powders, metal-carbides powders, and Co powder, each powder having a predetermined average particle size between 0.5 $\mu$m and 10 $\mu$m. These starting material powders were blended with each other into the compositions given in Table 1. After wet-mixing the starting material powders together for 72 hours in a ball mill and drying, the powders were pressed under a pressure of 1.5 ton/cm$^2$ into green compacts. The green compacts thus obtained were sintered under the following conditions: ambient pressure: $1 \times 10^{-2}$ torr; heating temperature: predetermined temperature between 1350° C. and 1500° C.; retaining time: 90 minutes, into the tungsten carbide based cemented carbide substrates having substantially the same compositions as the blended compositions. The surface portion of each tungsten carbide based cemented carbide substrate was ground by a grinding machine into a cutting-insert substrate shaped in conformity with SPGN 120308 of the ISO standards. Subsequently, the cutting insert substrate was heat-treated under the following conditions:
  ambient pressure: $1 \times 10^{-2}$ torr
  heating temperature: predetermined temperature between 1000° C. and 1600° C.
  retaining time: 30 minutes to 90 minutes.

The cobalt existing in the outermost portions of the heat-treated substrates was removed by etching with 5% solution of nitric acid for 5 minutes.

The surfaces of the cutting insert substrates were then, subjected to X-ray diffraction analysis under the following conditions:
lamp: Cu
filter: Ni
lamp voltage: 40 kV
lamp current: 40 mA
time constant: 5
recorder rate: 40 mm/$2\theta$ (degree)
recorder full scale: 10000 cps.

The cutting insert substrates having the Co-removed surface portions were dipped and activated in a dispersion solution of diamond powders, each powder having an average particle size of 15 μm, in alcohol under the following conditions: ultrasonic frequency of 2000 Hz; power output of 240 W; retaining time: 15 minutes. The substrate was then inserted in a tube reactor of quartz having a 120 mm diameter with a filament made of W (metal) and was subjected to vapor-deposition reaction for the predetermined time between 3 hours and 10 hours under the following conditions: ambient pressure: 35 torr, temperature of the substrate: 850° C., ambient gas: $CH_4/H_2=0.01$, to form a diamond coating having an average thickness shown in Table 1 on the surface of the cutting-insert substrate. Thus, the diamond-coated cutting inserts of tungsten carbide based cemented carbide in accordance with the present invention, the cutting inserts of this invention 1-23 were obtained. In the cutting inserts of this invention 1, 2, 5, 9, and 10, the chemical etching operation for removing the cobalt existing in the outermost portion of the substrate was omitted. In the cutting inserts of this invention 9, 10, 15, 16, 20, 21, and 23, the activating opeation by using ultrasonic wave was omitted.

The cutting inserts of this invention 1-23 thus obtained were again subjected to the X-ray diffraction analysis under the same conditions described above. Namely, the substrate before diamond coating and the cutting insert after diamond coating were both subjected to the X-ray diffraction analysis.

In the X-ray diffraction analysis, the substrate and the cutting insert showed two diffraction peaks $K\alpha_1$, $K\alpha_2$ indexed by index of plane (211) for tungsten carbide as illustrated in FIG. 1. According to the two peaks $K\alpha_1$, $K\alpha_2$, the ratio of $l_1/l_2$ was calculated as to the cutting inserts of this invention and are shown in Table 1.

For comparison purposes, comparative cutting inserts 1-23 having the same compositions as the cutting inserts of this invention 1-23, respectively, were manufactured under almost the same processes and conditions as in the cutting inserts of this invention, but the heat-treating operation (between 1000° C. and 1600° C.) after grinding the tungsten carbide based cemented carbide substrate was omitted. Both of the comparative cutting insert substrate before diamond coating and the cutting insert after diamond coating were also subjected to the X-ray diffraction analysis under the same conditions described above.

Next, the cutting inserts of this invention 1-23 and the comparative cutting inserts 1-23 were subjected to a dry-type milling test. The conditions were as follows:
Workpiece: Al-12% Si alloy steel block
Cutting speed: 550 m/minute
Depth of cut: 1.5 mm
Feed rate: 0.15 mm/tooth
Cutting time: 30 minutes.

The cutting inserts of this invention 1-23 and the comparative cutting inserts 1-23 were subjected to a dry-type turning test. The conditions were as follows:
Workpiece: Al-12% Si alloy steel bar
Cutting speed: 1000 m/minute
Depth of cut: 1 mm
Feed rate: 0.2 mm/revolution
Cutting time: 30 minutes.

The cutting inserts having corners were examined for separation. The number of corners in which the diamond coatings had separated from the cutting-insert substrates is given in Table 1 out of a total of 10.

According to the results given in Table 1, all the cutting inserts of this invention had the two diffraction peaks $K\alpha_1$, $K\alpha_2$, indexed by index of plane (211) for tungsten carbide in X-ray diffraction, which satisfy the relationship of $l_1/l_2 \leq 35$. The cutting inserts of this invention showed superior cutting performance such as little separation of the diamond coating separated from the cutting-insert substrate and having wear resistance under the drastic cutting-conditions of continuous high-speed cutting or high-feed cutting, because bonding strength between the diamond coating and the tungsten carbide based cemented carbide substrate was great high. On the contrary, in the X-ray diffraction analysis of the comparative cutting inserts, the comparative cutting inserts had one or two diffraction peaks $K\alpha_1$, $K\alpha_2$ and the ratio $l_1/l_2$ was not less than 35. The diamond coatings were separated from the surface portions of the tungsten carbide based cemented carbide substrates in more than half of the comparative cutting inserts, and extreme wear was observed because bonding strength between the diamond coating and the cutting-insert substrate was not sufficient.

TABLE 1

| Sample No. | Composition of Substrate (% by weight) | | | Heat-treating [Temperature/Time (°C./hours)] | Chemical Etching | Ultrasonic Wave Treatment | Average Diamond-coating Thickness (μm) | The Number of Corners Having Diamond-coating-separation out of 10 | | $l_1/l_2$ | |
|---|---|---|---|---|---|---|---|---|---|---|---|
| | Co | Metal Carbide or its Solid-solution | WC | | | | | Milling Test | Turning Test | Before Diamond Coating | After Diamond Coating |
| Cutting Insert of This Invention | | | | | | | | | | | |
| 1 | 1 | — | bal. | 1500/1.5 | X | ○ | 8.0 | 2 | 1 | 34.9 | 34.9 |
| 2 | 1 | TaC: 0.5 | bal. | 1500/1.5 | X | ○ | 8.0 | 2 | 1 | 32.2 | 32.2 |
| 3 | 3 | — | bal. | 1500/1 | ○ | ○ | 5.0 | 1 | 1 | 32.0 | 32.0 |
| 4 | 3 | TaC: 0.5 | bal. | 1500/1 | ○ | ○ | 5.0 | 0 | 0 | 30.8 | 30.8 |
| 5 | 3 | (W, Ti)C: 3 | bal. | 1500/1 | X | ○ | 5.0 | 1 | 0 | 28.9 | 28.9 |
| 6 | 3 | $Cr_3C_2$: 0.3 | bal. | 1500/1 | ○ | ○ | 5.0 | 0 | 0 | 27.2 | 27.2 |

TABLE 1-continued

| Sample No. | Composition of Substrate (% by weight) Co | Composition of Substrate (% by weight) Metal Carbide or its Solid-solution | Composition of Substrate (% by weight) WC | Heat-treating [Temperature/ Time (°C./hours)] | Chemical Etching | Ultrasonic Wave Treatment | Average Diamond-coating Thickness (μm) | The Number of Corners Having Diamond-coating-separation out of 10 Milling Test | The Number of Corners Having Diamond-coating-separation out of 10 Turning Test | $l_1/l_2$ Before Diamond Coating | $l_1/l_2$ After Diamond Coating |
|---|---|---|---|---|---|---|---|---|---|---|---|
| 7 | 6 | — | bal. | 1450/1 | ○ | ○ | 4.5 | 1 | 0 | 17.5 | 17.5 |
| 8 | 6 | TaC: 1 | bal. | 1450/1 | ○ | ○ | 4.5 | 0 | 0 | 22.0 | 22.0 |
| 9 | 6 | (W, Ti)C: 6 | bal. | 1450/1 | X | X | 4.5 | 1 | 1 | 14.7 | 14.7 |
| 10 | 6 | (W, Ti, Ta)C: 6 | bal. | 1450/1 | X | X | 4.5 | 2 | 1 | 10.5 | 10.5 |
| 11 | 6 | $Cr_3C_2$: 0.5 | bal. | 1450/1 | ○ | ○ | 4.5 | 0 | 0 | 11.2 | 11.2 |
| 12 | 6 | $Cr_3C_2$: 0.5, VC: 0.2 | bal. | 1450/1 | ○ | ○ | 4.5 | 0 | 0 | 19.8 | 19.8 |
| 13 | 8 | — | bal. | 1400/0.5 | ○ | ○ | 3.0 | 1 | 1 | 11.8 | 11.8 |
| 14 | 8 | TaC: 1 | bal. | 1400/0.5 | ○ | ○ | 3.0 | 0 | 0 | 15.9 | 15.9 |
| 15 | 8 | (W, Ti)C: 6 | bal. | 1400/0.5 | ○ | X | 3.0 | 1 | 1 | 10.1 | 10.1 |
| 16 | 8 | (W, Ti, Ta)C: 6 | bal. | 1400/0.5 | ○ | X | 3.0 | 2 | 1 | 9.8 | 9.8 |
| 17 | 8 | $Cr_3C_2$: 0.5, VC: 0.2 | bal. | 1400/0.5 | ○ | ○ | 3.0 | 0 | 0 | 16.7 | 16.7 |
| 18 | 10 | — | bal. | 1300/0.5 | ○ | ○ | 1.5 | 1 | 1 | 6.2 | 6.2 |
| 19 | 10 | TaC: 1 | bal. | 1300/0.5 | ○ | ○ | 1.5 | 1 | 0 | 8.8 | 8.8 |
| 20 | 10 | (W, Ti)C: 6 | bal. | 1300/0.5 | ○ | X | 1.5 | 1 | 1 | 7.1 | 7.1 |
| 21 | 10 | (W, Ti, Ta)C: 6 | bal. | 1300/0.5 | ○ | X | 0.8 | 2 | 2 | 6.8 | 6.8 |
| 22 | 10 | $Cr_3C_2$: 0.5, VC: 0.2 | bal. | 1300/0.5 | ○ | ○ | 0.8 | 1 | 0 | 8.2 | 8.2 |
| 23 | 10 | (W, Ti, Ta)C: 10, TiN: 1 | bal. | 1300/0.5 | ○ | X | 0.8 | 2 | 2 | 8.8 | 8.8 |
| Comparative Cutting Insert | | | | | | | | | | | |
| 1 | 1 | — | bal. | 1650*3/0.5 | — | — | — | — | — | — | — |
| 2 | 1 | TaC: 0.5 | bal. | 1650*3/0.5 | — | — | — | — | — | — | — |
| 3 | 3 | — | bal. | —*1 | ○ | ○ | 5.0 | 10 | 10 | —*2 | —*2 |
| 4 | 3 | TaC: 0.5 | bal. | —*1 | ○ | ○ | 5.0 | 10 | 10 | —*2 | —*2 |
| 5 | 3 | (W, Ti)C: 3 | bal. | —*1 | X | ○ | 5.0 | 10 | 10 | —*2 | —*2 |
| 6 | 3 | $Cr_3C_2$: 0.3 | bal. | —*1 | ○ | ○ | 5.0 | 10 | 10 | —*2 | —*2 |
| 7 | 6 | — | bal. | —*1 | ○ | ○ | 4.5 | 9 | 9 | 50.1 | 50.1 |
| 8 | 6 | TaC: 1 | bal. | —*1 | ○ | ○ | 4.5 | 8 | 8 | —*2 | —*2 |
| 9 | 6 | (W, Ti)C: 6 | bal. | —*1 | X | X | 4.5 | 10 | 10 | 47.7 | 47.7 |
| 10 | 6 | (W, Ti, Ta)C: 6 | bal. | —*1 | X | X | 4.5 | 10 | 10 | 43.2 | 43.2 |
| 11 | 6 | $Cr_3C_2$: 0.5 | bal. | —*1 | ○ | ○ | 4.5 | 9 | 9 | 44.5 | 44.5 |
| 12 | 6 | $Cr_3C_2$: 0.5, VC: 0.2 | bal. | —*1 | ○ | ○ | 4.5 | 9 | 8 | —*2 | —*2 |
| 13 | 8 | — | bal. | —*1 | ○ | ○ | 3.0 | 10 | 10 | 45.3 | 45.3 |
| 14 | 8 | TaC: 1 | bal. | —*1 | ○ | ○ | 3.0 | 10 | 10 | 40.1 | 40.1 |
| 15 | 8 | (W, Ti)C: 6 | bal. | —*1 | ○ | X | 3.0 | 10 | 10 | 39.8 | 39.8 |
| 16 | 8 | (W, Ti, Ta)C: 6 | bal. | —*1 | ○ | X | 3.0 | 10 | 10 | 46.7 | 46.7 |
| 17 | 8 | $Cr_3C_2$: 0.5, VC: 0.2 | bal. | —*1 | ○ | ○ | 3.0 | 10 | 10 | 42.1 | 42.1 |
| 18 | 10 | — | bal. | 900/1 | ○ | ○ | 1.5 | 10 | 9 | 44.8 | 44.8 |
| 19 | 10 | TaC: 1 | bal. | 900/1 | ○ | ○ | 1.5 | 10 | 10 | 43.1 | 43.1 |
| 20 | 10 | (W, Ti)C: 6 | bal. | 900/1 | ○ | X | 1.5 | 10 | 8 | 42.8 | 42.8 |
| 21 | 10 | (W, Ti, Ta)C: 6 | bal. | 900/1 | ○ | X | 0.8 | 10 | 8 | 44.2 | 44.2 |
| 22 | 10 | $Cr_3C_2$: 0.5, VC: 0.2 | bal. | 900/1 | ○ | ○ | 0.8 | 10 | 9 | 44.5 | 44.5 |
| 23 | 10 | (W, Ti, Ta)C: 10, TiN: 1 | bal. | 900/1 | ○ | X | 0.8 | 10 | 8 | 43.1 | 43.1 |

○: Subjected to Chemical Etching or Ultrasonic Wave Treatment
X: Not Subjected to Chemical Etching or Ultrasonic Wave Treatment
—*1No Heat-treating
—*2One Peak
*3Surface roughness was abnormally increased

What is claimed is:

1. A tool member having a tungsten carbide based cemented carbide substrate and a diamond coating deposited on said substrate, said substrate having two diffraction peaks $K\alpha_1$ and $K\alpha_2$ indexed by index of plane (211) for tungsten carbide in X-ray diffraction, said two diffraction peaks $K\alpha_1$ and $K\alpha_2$ satisfying the relationship of $L_1/L_2 \leq 35$, where $L_1$ and $L_2$ are heights of said peaks $K\alpha_1$ and $K\alpha_2$ measured from a base of a trough between said two diffraction peaks, whereby a bonding strength between said substrate and said diamond coating is increased wherein said diamond coating has an average layer thickness of 0.5 μm to 20 μm, said tungsten carbide based cemented carbide containing, apart from unavoidable impurities, 1% by weight to 25% by weight of cobalt as a binder phase forming component and the balance tungsten carbide as a dispersed phase forming component.

2. A tool member as recited in claim 1, wherein said diamond coating has an average layer thickness of 0.5 μm to 20 μm, said tungsten carbide based cemented carbide containing, apart from unavoidable impurities, 1% by weight to 25% by weight of cobalt as a binder phase forming component; 0.5% by weight to 30% by weight of at least one material selected from the group consisting of carbides, nitrides and carbo-nitrides of metals selected from Groups $IV_A$, $V_A$, and $VI_A$ of the Periodic Table, and solid-solutions of said carbides, nitrides and carbonitrides, as a dispersed phase forming component, and balance tungsten carbide as the dispersed phase forming component.

3. A tungsten carbide based cemented carbide substrate for a diamond coated tool member, having two diffraction peaks $K\alpha_1$ and $K\alpha_2$ indexed by index of plane (211) for tungsten carbide in X-ray diffraction, said two diffraction peaks $K\alpha_1$ and $K\alpha_2$ satisfying the relationship of $L_1/L_2 \leq 35$, where $L_1$ and $L_2$ are heights of said peaks $K\alpha_1$ and $K\alpha_2$ measured from a base of a trough between said two diffraction peaks, whereby bonding strength between said substrate and a diamond coating of the diamond diamond coated tool member is increased wherein said diamond coating has an average layer thickness of 0.5 μm to 20 μm, said tungsten carbide based cemented carbide containing, apart from unavoidable impurities, 1% by weight to 25% by weight of cobalt as a binder phase forming component and the balance tungsten carbide as a dispersed phase forming component.

* * * * *